United States Patent
Ambrose et al.

(10) Patent No.: US 10,910,544 B2
(45) Date of Patent: Feb. 2, 2021

(54) USING A MAGNETIC JOSEPHSON JUNCTION DEVICE AS A PI INVERTER

(71) Applicant: Microsoft Technology Licensing, LLC, Redmond, WA (US)

(72) Inventors: Thomas F. Ambrose, Crownsville, MD (US); James M. Murduck, Ellicott City, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 32 days.

(21) Appl. No.: 16/285,922

(22) Filed: Feb. 26, 2019

(65) Prior Publication Data
US 2020/0274049 A1   Aug. 27, 2020

(51) Int. Cl.
*G11C 11/44*  (2006.01)
*H01L 39/22*  (2006.01)
*H01L 39/12*  (2006.01)

(52) U.S. Cl.
CPC ............ *H01L 39/223* (2013.01); *G11C 11/44* (2013.01); *H01L 39/12* (2013.01)

(58) Field of Classification Search
CPC .............................. G11C 11/44; H01L 39/223
USPC ........................................................ 365/162
See application file for complete search history.

(56) References Cited

U.S. PATENT DOCUMENTS

| | | | | |
|---|---|---|---|---|
| 6,891,584 B1* | 5/2005 | Kashima | ............. | G02F 1/13362 349/98 |
| 9,281,057 B1* | 3/2016 | Herr | ......................... | G11C 11/44 |
| 10,447,278 B1* | 10/2019 | Reohr | ..................... | G06N 10/00 |
| 2013/0188421 A1* | 7/2013 | Dieny | ................. | G11C 11/1675 365/158 |

(Continued)

FOREIGN PATENT DOCUMENTS

RU    2620027 C1   5/2017
WO    0239509 A2   5/2002

OTHER PUBLICATIONS

Feofanov, et al., "Implementation of Superconductor-Ferromagnet-Superconductor Pi-Shifters in Superconducting Digital and Quantum Circuits", In the Repository of arXiv:1005.1581, May 10, 2010, 14 Pages.*

(Continued)

*Primary Examiner* — Muna A Techane
(74) *Attorney, Agent, or Firm* — Ranjeev Singh; Singh Law, PLLC

(57) ABSTRACT

Superconducting circuits and memories that use a magnetic Josephson junction (MJJ) device as a pi inverter are disclosed. The MJJ device includes superconducting layers configured to allow a flow of a supercurrent through the MJJ device. The MJJ device further includes a magnetic layer arranged between the superconducting layers, where the magnetic layer has an associated magnetization direction, and where the first state of the MJJ device corresponds to a zero-phase of a supercurrent flowing through the MJJ device (Continued)

and the second state of the MJJ device corresponds to a π-phase of the supercurrent flowing through the MJJ device. In response to an application of a magnetic field, without any change in the magnetization direction of the magnetic layer, the MJJ device is configured to switch from the first state to the second state responsive to a change in a phase of the supercurrent.

20 Claims, 6 Drawing Sheets

(56) References Cited

U.S. PATENT DOCUMENTS

| 2018/0025775 | A1* | 1/2018 | Ambrose | H01L 39/12 |
| | | | | 257/35 |
| 2020/0075093 | A1* | 3/2020 | Naaman | G11C 11/1675 |
| 2020/0090738 | A1* | 3/2020 | Naaman | G11C 11/1657 |

OTHER PUBLICATIONS

"International Search Report and Written Opinion Issued in PCT Application No. PCT/US20/017804", dated Jun. 17, 2020, 13 Pages.

* cited by examiner

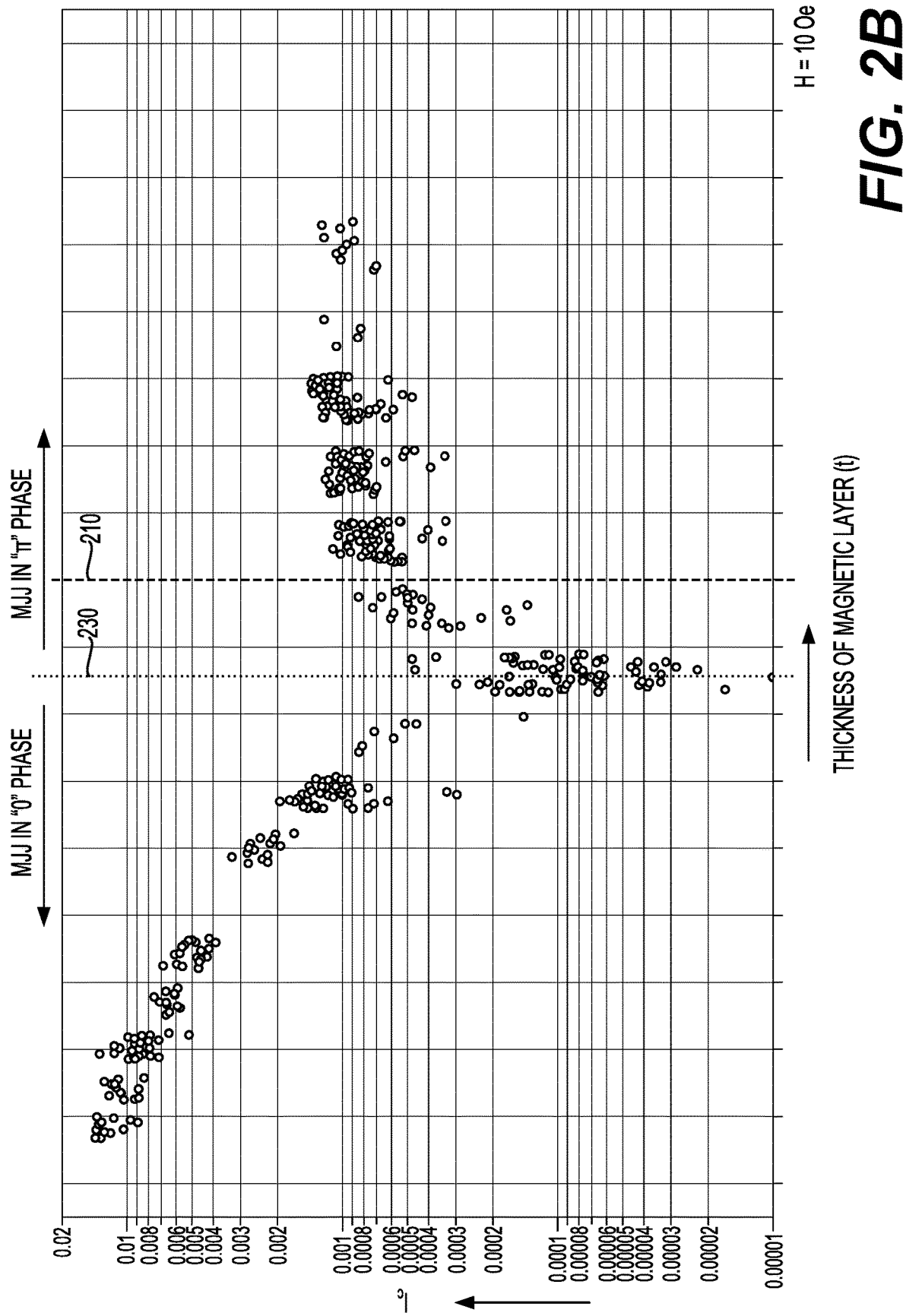

USING A MAGNETIC JOSEPHSON JUNCTION DEVICE AS A PI INVERTER

BACKGROUND

Semiconductor based integrated circuits used in electronic devices include digital circuits and memories based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based circuits and memories are superconducting logic-based circuits and memories. Superconducting logic-based circuits and memories often include devices with magnetic layers.

SUMMARY

In one example, the present disclosure relates to a magnetic Josephson junction (MJJ) device. The MJJ device may include a first superconducting layer and a second superconducting layer, where each of the first superconducting layer and the second superconducting layer is configured to allow a flow of a supercurrent through the MJJ device. The MJJ device may further include a magnetic layer arranged between the first superconducting layer and the second superconducting layer, where the magnetic layer has an associated magnetization direction, and where the first state of the MJJ device corresponds to a zero-phase of a supercurrent flowing through the MJJ device and the second state of the MJJ device corresponds to a $\pi$-phase of the supercurrent flowing through the MJJ device, and where in response to an application of a magnetic field, without any change in the magnetization direction of the magnetic layer, the MJJ device is configured to switch from the first state to the second state responsive to a change in a phase of the supercurrent from either the zero-phase to the $\pi$-phase or from the $\pi$-phase to the zero-phase caused by the application of the magnetic field to the magnetic layer.

In another aspect, a method in a magnetic Josephson junction (MJJ) device configurable to be in a first state or a second state, where the MJJ device comprises a first superconducting layer, a second superconducting layer, where each of the first superconducting layer and the second superconducting layer is configured to allow a flow of a supercurrent through the MJJ device, and a magnetic layer arranged between the first superconducting layer and the second superconducting layer, where the magnetic layer has an associated magnetization direction, and where the first state of the MJJ device corresponds to a zero-phase of a supercurrent flowing through the MJJ device and the second state of the MJJ device corresponds to a $\pi$-phase of the supercurrent flowing through the MJJ device. The method may include applying a magnetic field to the magnetic layer such that, without any change in the magnetization direction of the magnetic layer, the MJJ device switches from the first state to the second state responsive to a change in a phase of the supercurrent from either the zero-phase to the $\pi$-phase or from the $\pi$-phase to the zero-phase caused by the application of the magnetic field to the magnetic layer.

In yet another aspect, the present disclosure relates to a memory system including a plurality of memory cells, where each of the plurality of memory cells may be configurable to be in a first state or a second state, and where each of the plurality of memory cells includes a magnetic Josephson junction (MJJ) device. The MJJ device includes a first superconducting layer, a second superconducting layer, where each of the first superconducting layer and the second superconducting layer is configured to allow a flow of a supercurrent through the MJJ device, and a magnetic layer arranged between the first superconducting layer and the second superconducting layer, where the magnetic layer has an associated magnetization direction. The first state of the memory cell corresponds to a zero-phase of a supercurrent flowing through the MJJ device and the second state of the memory cell corresponds to a $\pi$-phase of the supercurrent flowing through the MJJ device, and where in response to an application of a magnetic field, without any change in the magnetization direction of the magnetic layer, a memory cell is configured to switch from the first state of the memory cell to the second state of the memory cell responsive to a change in a phase of the supercurrent from either the zero-phase to the $\pi$-phase or from the $\pi$-phase to the zero-phase caused by the application of the magnetic field.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. As an example, the terms such as the first layer, the second layer, and the third layer are merely used to specify different layers. These terms do not imply a specific arrangement or a particular order of creating these layers.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIGS. 2A and 2B show example changes in the phase of the supercurrent from the "0" phase to the "$\pi$" phase in the presence of two different amounts of external magnetic fields for an MJJ device in accordance with one example;

DETAILED DESCRIPTION

Figure 1:
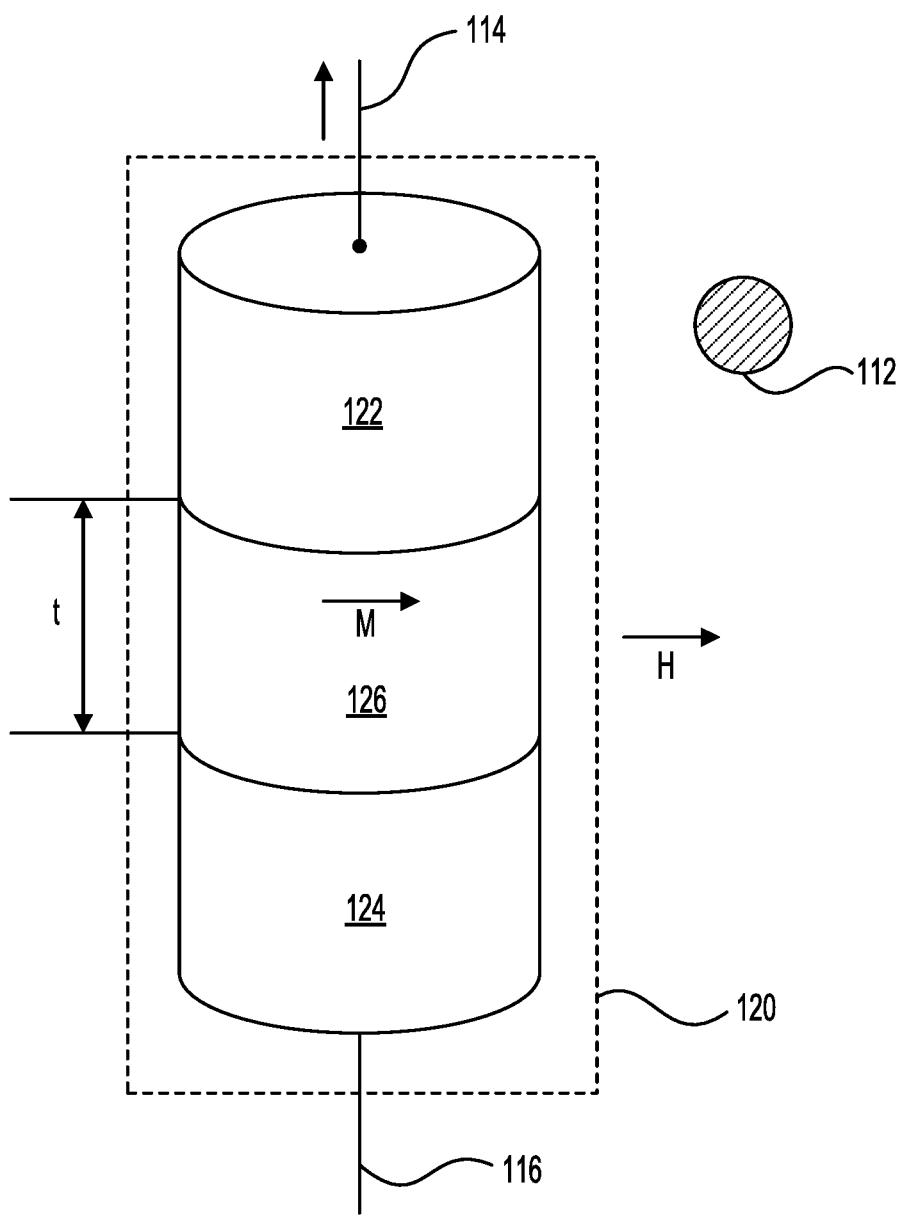
FIG. 1 shows a diagram of a superconducting circuit including a magnetic Josephson junction (MJJ) device in accordance with one example.

Examples described in this disclosure relate to a magnetic Josephson Junction (MJJ) device with superconducting layers and a magnetic layer and related systems and methods. Certain examples further relate to superconducting circuits and memories that may include using the MJJ device as a pi inverter. Other examples relate to reciprocal quantum logic (RQL) compatible circuits and memories. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be aluminum oxide. In SIS type junctions, the superconducting electrons are described by a quantum mechanical wave-function. A changing phase difference in time of the phase of the superconducting electron wave-function between the two superconductors corresponds to a potential difference between the two superconductors. In RQL circuits, in one example, the SIS type junction may be part of a superconducting loop. When the time integral of the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines, can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

Certain examples in this disclosure relate to using a magnetic Josephson junction (MJJ) with a weak ferromagnetic layer (e.g., $M_S$<50 kA/m); the phase of a supercurrent can be changed by application of a small magnetic field which along with the magnetic layer thickness modifies the "0-π" transition point. A conventional room temperature spintronic circuit contains ferromagnetic layers that polarize the electrical current due to the splitting of the electronic band structure in ferromagnetic materials. Electrical currents exiting a ferromagnetic material can be distinguished as a polarized current where two distinct currents flow, denoted as spin up and spin down current respectively. Many magneto-transport phenomena such as Giant Magneto-Resistance exist due to these spin polarized currents. Similarly, in a superconductor for spin singlet, two distinct current phases (0 phase or π phase) of supercurrent exist when passed through a ferromagnetic layer. The phase is determined by the ferromagnetic layer's thickness and the external magnetic field that is applied to the ferromagnetic layer.

Unlike the conventional spin current which depends upon the ferromagnetic layer's spin polarization, a supercurrent can be pure 0 phase or π phase. The transition from the "0" phase to "π" phase and vice versa (where the critical current flowing through the junction becomes zero) depends not only upon the saturation magnetization of the ferromagnetic material but also on the application of an external magnetic field. The magnetic field dependence of the "0-π" transition may advantageously be used to fabricate a device which can change the supercurrent phase upon the application of a small magnetic field. Advantageously, the inverting of the phase of the supercurrent in superconducting circuits may allow incorporation of new logic and memory devices into existing architectures. An example device may be a three layer MJJ device, which may be fabricated using processing techniques, such as physical vapor deposition. In addition, example devices may utilize very weak ferromagnets (e.g., $M_S$ values <50 kA/m) where inversion of the supercurrent from "0" phase to "π" phase can occur at a very high frequency (e.g., even THz). In addition, in the example devices, there is no need to switch the ferromagnetic magnetization direction of any magnetic layers in the MJJ device.

FIG. 1 shows a diagram of a superconducting circuit 100 including a magnetic Josephson junction (MJJ) device 120. MJJ device 120 may include a superconducting layer 122 and another superconducting layer 124. Each layer may be formed using a superconducting material, e.g., niobium. MJJ device 120 may further include a magnetic layer 126 arranged between superconducting layer 122 and superconducting layer 124. In one example, magnetic layer 126 may be a ferromagnetic layer. In one example, the ferromagnetic layer may be compatible with single flux quantum (SFQ) pulse-based circuits. Magnetic layer 126 may have very soft magnetic properties to allow for changes in its magnetization in response to small magnetic fields. Magnetic layer 126 may be a ferromagnetic metal or an alloy of several magnetic and non-magnetic materials. As an example, magnetic layer 126 may be $(Ni_xCu_{1-x})_yPd_{1-y}$, with a nickel concentration of less than 10%. In another example, magnetic layer 126 may be a $Ni_xPd_{1-x}$ alloy with a nickel concentration of less than 5%. The alloy used to form magnetic layer 126 may also be a Ni—Fe alloy, a Ni—Co alloy, an Fe—Co alloy, or a Co—Ni—Fe alloy. In another example, magnetic layer 126 may include a Ni—Fe alloy doped with zirconium (Zr). In other examples, magnetic layer 126 may include a Ni—Fe alloy doped with chromium, molybdenum, or hafnium. In other examples, other transition metals may be doped into NiFe to reduce the saturation magnetization accordingly.

With continued reference to FIG. 1, the thickness of magnetic layer 126 may be selected to enable the transition of the MJJ device between a "zero state" and a "π state" in response to an application of a magnetic field. A current or supercurrent may be passed through MJJ device 120 via a conductor 114 coupled to superconducting layer 122 and another conductor 116 coupled to superconducting layer 124. The supercurrent flowing through magnetic layer 126 may vary non-monotonically based on a thickness (t) of magnetic layer 126. As an example, the variation in the supercurrent may be a result of the Cooper pairs in the presence of an exchange field lowering the potential energy of the Cooper pairs. The current passing through MJJ device 120 may become zero at a specific layer thickness where the phase of the current will change from "0" phase to "π" phase. The thickness (t) of magnetic layer 126 at which this phase transitions occurs may be proportional to the saturation magnetization of the magnetic layer 126 and the properties of the superconducting electrodes, such as superconducting layers 122 and 124. The thickness (t) of magnetic layer 126 where the critical current ($I_c$) becomes zero may be as follows:

$$t = \left(\frac{\pi \Delta_{SC}}{4V_F}\mu_0[(H + M_s)]\right),$$

where $\Delta_{SC}$ is the superconducting gap voltage, $V_F$ is the Fermi velocity of the superconducting electrodes, H is the applied magnetic field and $M_S$ is the saturation magnetization of magnetic layer 126. Thus, the thickness (t) is a function of both the saturation magnetization ($M_S$) of the magnetic layer and an amount of an external magnetic field (H) applied to the magnetic layer. For an external magnetic field of 0 Oe versus an external magnetic field of 10 Oe, at larger values of saturation magnetization (e.g., $M_S$>50 kA/m) there is a minimal difference in the thickness value at which the critical current becomes zero. In contrast, in this example, for the same external magnetic filed of 0 Oe versus the external magnetic field of 10 Oe, at smaller values of saturation magnetization (e.g., $M_S$<50 kA/m) the difference in the thickness value at which the critical current becomes zero is notable. In one example, a thickness of the magnetic layer may be selected such that the change in the phase of the supercurrent from either the zero-phase to the π-phase or from the π-phase to the zero-phase occurs in response to the magnetic field having a magnetizing field strength in a range between 1 Oersted (Oe) to 50 Oersted (Oe).

Still referring to FIG. 1, in one example, MJJ device 120 may be a superconductor with only one magnetic layer (e.g., a single ferromagnetic layer). Any of the layers described as part of the present disclosure may be formed using physical vapor deposition (PVD) techniques, such as sputtering. Although a certain number of layers of the MJJ device 120 arranged in a certain manner are described, there could be more or fewer layers arranged differently. As an example, although FIG. 1 does not show additional layers arranged between superconducting layer 122 and superconducting layer 124, antiferromagnetic layers may be added. As an example, an antiferromagnetic layer may be arranged adjacent to magnetic layer 126. Examples of antiferromagnetic materials include, but are not limited to, ferromagnesium (FeMn), nickel-oxide (NiO), and chromium-oxide ($Cr_2O_3$). As explained later, the addition of the antiferromagnetic layers may be advantageous in increasing the stability of the device as a whole and yet not adversely affecting the operation of the device.

Figure 2A:
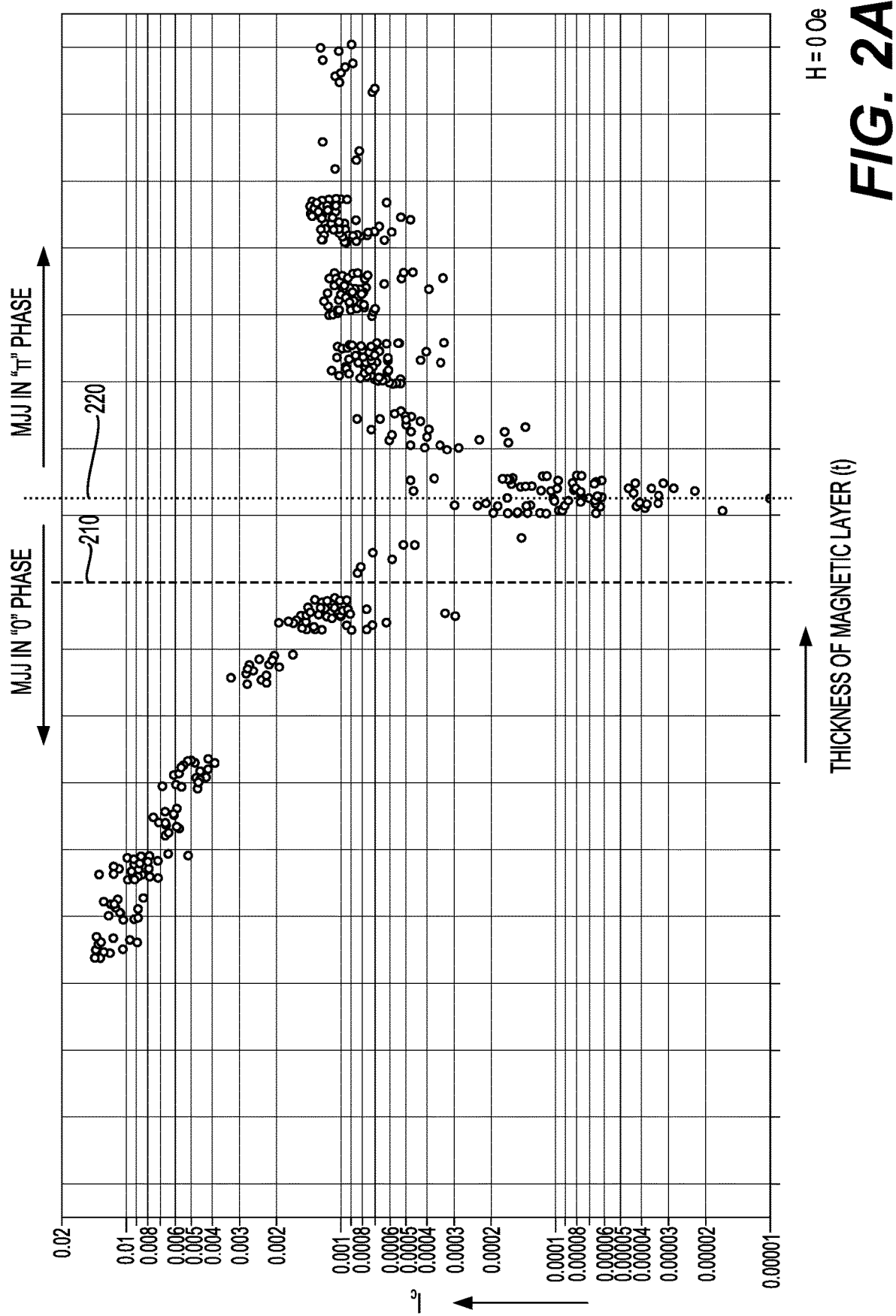

FIGS. 2A and 2B show example changes in the phase of the supercurrent from the "0" phase to the "π" phase in the presence of two different amounts of external magnetic fields for an MJJ device. In this example, the MJJ device includes a magnetic layer having a saturation magnetization ($M_S$) of 35 kA/m and having a thickness (t). The changes in the phase of supercurrent are shown in the presence of two different amounts of magnetic fields (H=0 Oe and H=10 Oe). FIG. 2A shows the phase (y-axis) of a supercurrent (Ic) and its magnitude (x-axis) when the external magnetic (H) is set to a value of 0 Oersted (Oe). FIG. 2A shows that when the value of the external magnetic field (H) is set to 0 Oe, the MJJ device is in the "0" phase. Dotted line 210 corresponds to a thickness value of MJJ device 120. Dotted line 220 shows the point at which the supercurrent flowing through MJJ device 120 is substantially zero. FIG. 2B shows the phase (y-axis) of a supercurrent (Ic) and its magnitude (x-axis) when the external magnetic (H) is set to a value of 10 Oe. FIG. 2B shows that when the value of the external magnetic field (H) is set to 10 Oe, the MJJ device is in the "π" phase. Dotted line 210 corresponds to the thickness value of MJJ device 120. Dotted line 230 shows the point at which the supercurrent flowing through MJJ device 120 is substantially zero. Thus, in this example, the phase of the supercurrent in the MJJ device changes in response to a relatively small magnetic field. Moreover, in this example, advantageously the switch from "0" phase to "π" phase does not depend upon switching the magnetization direction of any magnetic layer (or magnetic layers) in MJJ device 120.

Figure 3:
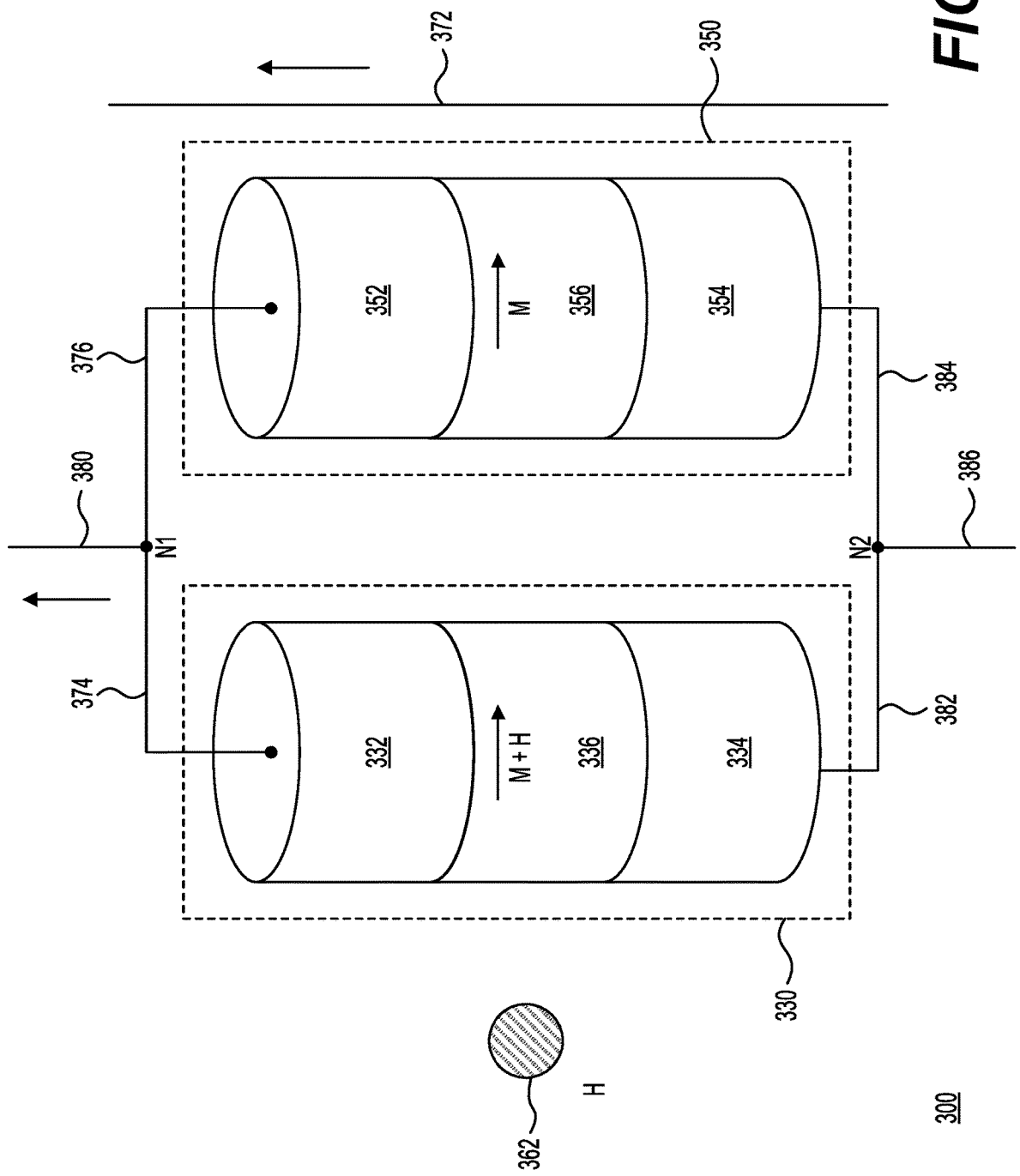
FIG. 3 shows a superconducting circuit 300 including MJJ device 330 and MJJ device 350 in accordance with one example.

FIG. 3 shows a superconducting circuit 300 including MJJ device 330 and MJJ device 350 in accordance with one example. MJJ device 330 may include a superconducting layer 332 and another superconducting layer 334. Each layer may be formed using a superconducting material, e.g., niobium. MJJ device 330 may further include a magnetic layer 336 arranged between superconducting layer 332 and superconducting layer 334. MJJ device 350 may include a superconducting layer 352 and another superconducting layer 354. Each layer may be formed using a superconducting material, e.g., niobium. MJJ device 350 may further include a magnetic layer 356 arranged between superconducting layer 352 and superconducting layer 354. Each of MJJ device 330 and MJJ device 350 may be MJJ device 120 of FIG. 1. Thus, in this example, the layers comprising each of these devices may be formed using similar techniques as described earlier with respect to FIG. 1. In addition, the composition and the materials used to form these devices may be similar to the composition and the materials used to form MJJ device 120 of FIG. 1. MJJ device 330 may be coupled via conductor 374 to a node N1. MJJ device 350 may be coupled via conductor 376 to the node N1. Conductor 380 may be coupled to the node N1 to provide an output from superconducting circuit 300. MJJ device 330 may be coupled via conductor 382 to a node N2. MJJ device 350 may be coupled via conductor 384 to the node N2. Conductor 386 may be coupled to the node N2 to receive an input for superconducting circuit 300. Control line 362 may be used to change a state of MJJ 330 from the "0-phase" to the "π-phase" in a similar fashion as explained earlier with respect to FIG. 1 and FIGS. 2A and 2B. A pulse may be generated at the node N1 and provided via conductor 380 as an output only when a necessary flux bias is provided via control line 372 to superconducting circuit 300 and the state of MJJ 330 is the "π-phase." Although FIG. 3 shows certain number of components of superconducting circuit 300 arranged in a certain manner, superconducting circuit 300 may include additional or fewer components arranged differently.

Figure 4:
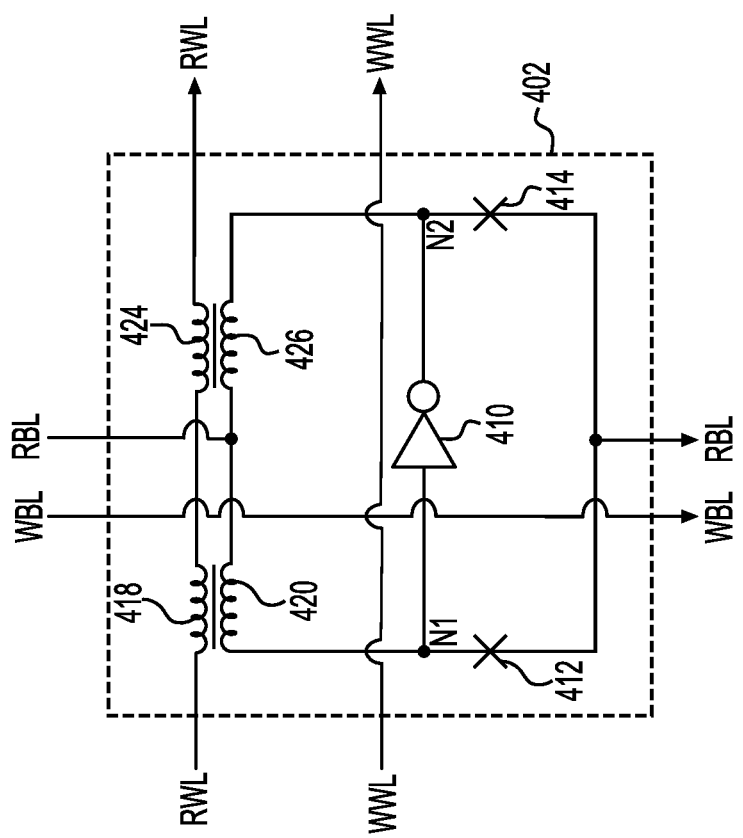
FIG. 4 shows an example memory cell with an MJJ device in accordance with one example.

FIG. 4 shows an example memory cell 400 that incorporates an MJJ device (e.g., MJJ device 120 of FIG. 1) in accordance with one example. Memory cell 400 may include a memory storage element 402 including at least one magnetic Josephson junction (MJJ) device 410 and at least two Josephson junctions 412 and 414 as shown in FIG. 4. In one example, each of Josephson junctions 412 and 414 may be a superconductor-insulator-superconductor (SIS) type of Josephson junction. In one example, Josephson junctions 412 and 414 may form a readout superconducting quantum interference device (SQUID). MJJ device 410 may be implemented as MJJ device 120 of FIG. 1 and may operate as explained with respect to FIG. 1 and FIGS. 2A and 2B earlier. Memory cell 400 may be coupled to word-lines and bit-lines for performing various memory operations, including, for example, read and write operations. As an example, a read word-line (RWL) for performing a read operation may be coupled to memory cell 400. In this example, the read word-line (RWL) may be coupled to memory cell 400 via inductors 418 and 420 and via inductors 424 and 426 as shown in FIG. 4. A write word-line (WWL) for performing a write operation may be coupled to memory cell 400. The write word-line may be coupled to MJJ device 410 to induce a magnetic field in the magnetic layer of MJJ device 410. In addition, a read bit-line (RBL) for performing a read operation may be coupled to memory cell 400. A write bit-line (WBL) for performing a write operation may also be coupled to memory cell 400. In this example, the write bit-line (WBL) may be coupled to induce a magnetic field in the magnetic layer of MJJ device 410. In this example, the magnetic field applied via the WBL that changes the state of MJJ device 410 from the "0-state" to the "π-state" is being used as a control mechanism for changing a state of memory element 402. In one example, the coupling with MJJ device 410 may be such that its state can be changed by the application of a local write word-line current and by the application of a write bit-line current. The change in the state of MJJ device 410 may result in a current flow which, in combination with the applied bit-read current, may trigger Josephson junction 412 and Josephson junction 414, sending the readout SQUID into a voltage state. This voltage may generate a current along the read bit-line, which may act as a transmission line with a certain impedance. This current may be sensed using a sense amplifier. In one example, the presence or absence of a current pulse, once amplified by the sense amplifier, may determine the state of memory cell 400 as logic '0' or logic '1'.

Microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a magnetic Josephson junction (MJJ) device, which may be configured such that under the application of appropriate amounts of current bias and magnetic flux, the memory cell may be in a logic '1' state or in a logic '0' state Memory cells may be arranged in rows and columns, such that each row can be activated by a common flux bias (e.g., a read word-line signal) and each bit-line may form a transmission line that may propagate the output of the memory cells to a sense amplifier at one end of the column. Memory cells in a column may be serially biased by a common current source; for example, a flux pump.

In one example, during a write operation, the write word-line (WWL) and the write bit-line (WBL) may receive current from the respective drivers. When a magnetic field is applied via any of these currents, MJJ device 410 may be in the "πstate." Conversely, when no magnetic field is applied, then MJJ device 410 may be in a "0 state." In one example, the "π state" may correspond to a logic '1' state and the "0 state" may correspond to a logic '0' state of memory cell 400. In general, magnetic materials have very short coherence lengths which means these materials significantly attenuate any supercurrent. Advantageously, in memory cell 400, MJJ device 410 is arranged such that it is not traversed by a high-density superconducting current (or supercurrent). Although FIG. 4 shows a certain number of components arranged in a certain manner, memory cell 400 may include additional or fewer components arranged differently.

Figure 5:
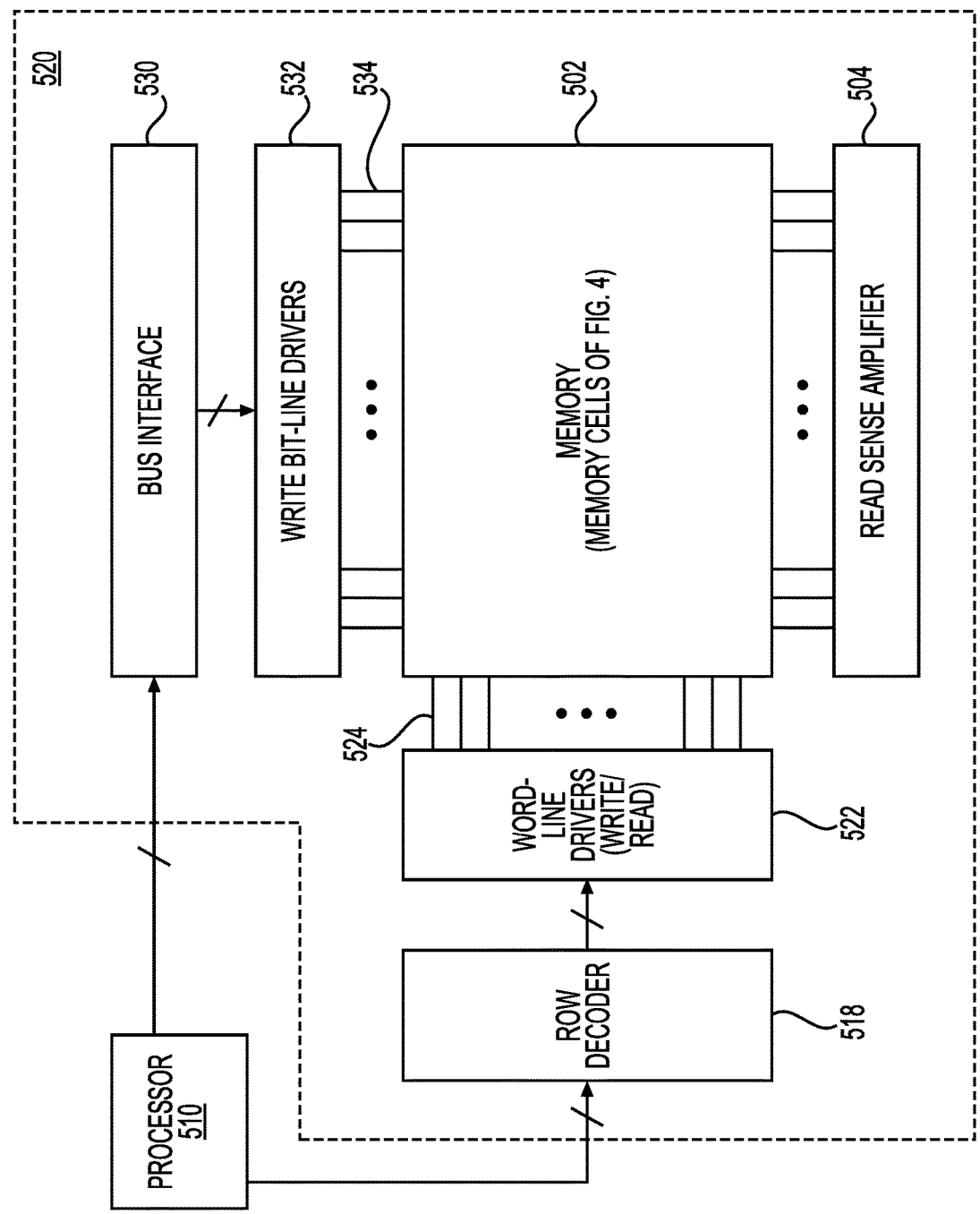
FIG. 5 shows a computing system including a memory system having at least one memory cell of FIG. 4 in accordance with one example.

FIG. 5 shows a computing system including a memory system having at least one memory cell 400 of FIG. 4 in accordance with one example. Computing system 500 may include a processor 510 coupled to a memory 520 in accordance with one example. Processor 510 may perform read or write operations on memory 520. Additionally, processor 510 and memory 520 may be used along with other superconducting logic based devices. In general, any superconducting device operating in cryogenic environments and requiring storage of instructions or data may include memory 520. Furthermore, processor 510 need not be in a cryogenic environment; instead, it may operate at non-cryogenic temperatures. In this example, memory 520 may be in a separate cryogenic environment and may be coupled via connectors to processor 510 in a way that the cryogenic environment can be maintained. Memory 520 may be used as part of storage in a data center for delivering cloud-based services, such as software as a service, platform as a service, or other services. Memory system 520 may include an array 502 of memory cells arranged in rows and columns. In one example, array 502 may be an array of memory cells, for example, memory cell 400 described earlier. Memory system 520 may further include a row decoder 518 that may be configured to decode row control/ address signals. Row decoder 518 may further be coupled to word-line drivers 522. Word-line drivers 522 may include circuitry to provide word-line read/write current to a subset or all of the memory cells associated with a selected word-line for any read or write operations. Word-line drivers 522 may provide such current via word-lines 524.

With continued reference to FIG. 5, memory system 520 may further include bus interface 530 that may be configured to receive control signals or other signals from processor 510. Bus interface 530 may further be coupled to bit-line drivers 532. Bit-line drivers 532 may include circuitry to provide bit-line read current to a subset or all of the memory cells associated with a selected bit-line for any read or write operations. Bit-line drivers 532 may provide such current via bit-lines 534. Bit-lines 534 may include both read bit-lines and write bit-lines. By using row and column addresses, any of the memory cells could be accessed using an address. Each of the bit-lines (e.g., bit-lines 534) may further be coupled to sense amplifier 504 for sensing bit-lines to determine the logical state of each of the array 502 of memory cells.

The coupling between the array 502 of memory cells and sense amplifier 504 may include radio frequency (RF)

transmission lines. The memory cells in each column may be serially current-biased by a common current source (e.g., a flux pump). Although FIG. 5 shows a certain number of components of computing system 500 and memory system 520 arranged in a certain manner, there could be more or fewer number of components arranged differently.

In conclusion, the present disclosure relates to a magnetic Josephson junction (MJJ) device. The MJJ device may include a first superconducting layer and a second superconducting layer, where each of the first superconducting layer and the second superconducting layer is configured to allow a flow of a supercurrent through the MJJ device. The MJJ device may further include a magnetic layer arranged between the first superconducting layer and the second superconducting layer, where the magnetic layer has an associated magnetization direction, and where the first state of the MJJ device corresponds to a zero-phase of a supercurrent flowing through the MJJ device and the second state of the MJJ device corresponds to a π-phase of the supercurrent flowing through the MJJ device, and where in response to an application of a magnetic field, without any change in the magnetization direction of the magnetic layer, the MJJ device is configured to switch from the first state to the second state responsive to a change in a phase of the supercurrent from either the zero-phase to the π-phase or from the π-phase to the zero-phase caused by the application of the magnetic field to the magnetic layer.

The switch from the first state to second state may occur when the supercurrent flowing through the MJJ device goes to zero. The MJJ device may not include any other magnetic layers. The MJJ device may be configured to switch from the first state to the second state without requiring any change in a magnetization direction including without requiring any change in the magnetization direction of the magnetic layer.

The MJJ device may comprise at least one antiferromagnetic layer arranged adjacent to the magnetic layer. Each of the first superconducting layer and the second superconducting layer may comprise niobium. A thickness of the magnetic layer may be selected such that the change in the phase of the supercurrent from either the zero-phase to the π-phase or from the π-phase to the zero-phase occurs in response to the magnetic field having a magnetizing field strength in a range between 1 Oersted to 50 Oersted.

In another aspect, a method in a magnetic Josephson junction (MJJ) device configurable to be in a first state or a second state, where the MJJ device comprises a first superconducting layer, a second superconducting layer, where each of the first superconducting layer and the second superconducting layer is configured to allow a flow of a supercurrent through the MJJ device, and a magnetic layer arranged between the first superconducting layer and the second superconducting layer, where the magnetic layer has an associated magnetization direction, and where the first state of the MJJ device corresponds to a zero-phase of a supercurrent flowing through the MJJ device and the second state of the MJJ device corresponds to a π-phase of the supercurrent flowing through the MJJ device. The method may include applying a magnetic field to the magnetic layer such that, without any change in the magnetization direction of the magnetic layer, the MJJ device switches from the first state to the second state responsive to a change in a phase of the supercurrent from either the zero-phase to the π-phase or from the π-phase to the zero-phase caused by the application of the magnetic field to the magnetic layer.

The MJJ device may switch from the first state to second state when the supercurrent flowing through the MJJ device goes to zero. The MJJ device may not include any other magnetic layers. The MJJ device may be configured to switch from the first state to the second state without requiring any change in a magnetization direction including without requiring any change in the magnetization direction of the magnetic layer.

The MJJ device may comprise at least one antiferromagnetic layer arranged adjacent to the magnetic layer. Each of the first superconducting layer and the second superconducting layer may comprise niobium. A thickness of the magnetic layer may be selected such that the change in the phase of the supercurrent from either the zero-phase to the π-phase or from the π-phase to the zero-phase occurs in response to the magnetic field having a magnetizing field strength in a range between 1 Oersted to 50 Oersted.

In yet another aspect, the present disclosure relates to a memory system including a plurality of memory cells, where each of the plurality of memory cells may be configurable to be in a first state or a second state, and where each of the plurality of memory cells includes a magnetic Josephson junction (MJJ) device. The MJJ device includes a first superconducting layer, a second superconducting layer, where each of the first superconducting layer and the second superconducting layer is configured to allow a flow of a supercurrent through the MJJ device, and a magnetic layer arranged between the first superconducting layer and the second superconducting layer, where the magnetic layer has an associated magnetization direction. The first state of the memory cell corresponds to a zero-phase of a supercurrent flowing through the MJJ device and the second state of the memory cell corresponds to a π-phase of the supercurrent flowing through the MJJ device, and where in response to an application of a magnetic field, without any change in the magnetization direction of the magnetic layer, a memory cell is configured to switch from the first state of the memory cell to the second state of the memory cell responsive to a change in a phase of the supercurrent from either the zero-phase to the π-phase or from the π-phase to the zero-phase caused by the application of the magnetic field.

The MJJ device may be coupled to a first Josephson junction and a second Josephson junction to form a loop. The memory cell may be coupled to a write-bit line, and the write bit-line may be configured to receive a write current as part of a write operation associated with the memory cell. The write current may be configured to apply the magnetic field to the magnetic layer.

A thickness of the magnetic layer may be selected such that the change in the phase of the supercurrent from either the zero-phase to the π-phase or from the π-phase to the zero-phase occurs in response to the magnetic field having a magnetizing field strength in a range between 1 Oersted to 50 Oersted. In the memory system, the MJJ device may further comprise at least one antiferromagnetic layer arranged adjacent to the magnetic layer.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 510, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate spatial, temporal, or other prioritization of such elements.

What is claimed:

1. A magnetic Josephson junction (MJJ) device configurable to be in a first state or a second state, the MJJ device comprising:
a first superconducting layer;
a second superconducting layer, wherein each of the first superconducting layer and the second superconducting layer is configured to allow a flow of a supercurrent through the MJJ device; and
a magnetic layer arranged between the first superconducting layer and the second superconducting layer, wherein the magnetic layer has an associated magnetization direction, and wherein the first state of the MJJ device corresponds to a zero-phase of a supercurrent flowing through the MJJ device and the second state of the MJJ device corresponds to a $\pi$-phase of the supercurrent flowing through the MJJ device, and wherein in response to an application of a magnetic field, without any change in the magnetization direction of the magnetic layer and without any change in a magnetization direction of each of other magnetic layers, if any, associated with the MJJ device, the MJJ device is configured to switch from the first state to the second state responsive to a change in a phase of the supercurrent from either the zero-phase to the $\pi$-phase or from the $\pi$-phase to the zero-phase caused by the application of the magnetic field to the magnetic layer.

2. The MJJ device of claim 1, wherein the switch from the first state to second state occurs when the supercurrent flowing through the MJJ device goes to zero.

3. The MJJ device of claim 1, wherein the MJJ device does not include any other magnetic layers.

4. The MJJ device of claim 1, wherein the MJJ device is configured to switch from the first state to the second state without requiring any change in a magnetization direction including without requiring any change in the magnetization direction of the magnetic layer.

5. The MJJ device of claim 1 further comprising at least one antiferromagnetic layer arranged adjacent to the magnetic layer.

6. The MJJ device of claim 1, wherein each of the first superconducting layer and the second superconducting layer comprises niobium.

7. The MJJ device of claim 1, wherein a thickness of the magnetic layer is selected such that the change in the phase of the supercurrent from either the zero-phase to the $\pi$-phase or from the $\pi$-phase to the zero-phase occurs in response to the magnetic field having a magnetizing field strength in a range between 1 Oersted to 50 Oersted.

8. A method in a magnetic Josephson junction (MJJ) device configurable to be in a first state or a second state, wherein the MJJ device comprises a first superconducting layer, a second superconducting layer, wherein each of the first superconducting layer and the second superconducting layer is configured to allow a flow of a supercurrent through the MJJ device, and a magnetic layer arranged between the first superconducting layer and the second superconducting layer, wherein the magnetic layer has an associated magnetization direction, and wherein the first state of the MJJ device corresponds to a zero-phase of a supercurrent flowing through the MJJ device and the second state of the MJJ device corresponds to a $\pi$-phase of the supercurrent flowing through the MJJ device, the method comprising:
applying a magnetic field to the magnetic layer such that, without any change in the magnetization direction of the magnetic layer and without any change in a magnetization direction of any other magnetic layers, if any, associated with the MJJ device, the MJJ device switches from the first state to the second state responsive to a change in a phase of the supercurrent from either the zero-phase to the $\pi$-phase or from the $\pi$-phase to the zero-phase caused by the application of the magnetic field to the magnetic layer.

9. The method of claim 8, wherein the MJJ device switches from the first state to second state when the supercurrent flowing through the MJJ device goes to zero.

10. The method of claim 8, wherein the MJJ device does not include any other magnetic layers.

11. The method of claim 8, wherein the MJJ device switches from the first state to the second state without requiring any change in a magnetization direction including without requiring any change in the magnetization direction of the magnetic layer.

12. The method of claim 8, wherein the MJJ device further comprises at least one antiferromagnetic layer arranged adjacent to the magnetic layer.

13. The method of claim 8, wherein each of the first superconducting layer and the second superconducting layer comprises niobium.

14. The method of claim 8, wherein a thickness of the magnetic layer is selected such that the change in the phase of the supercurrent from either the zero-phase to the $\pi$-phase or from the $\pi$-phase to the zero-phase occurs in response to the magnetic field having a magnetizing field strength in a range between 1 Oersted to 50 Oersted.

15. A memory system comprising:
a plurality of memory cells, wherein each of the plurality of memory cells is configurable to be in a first state or a second state, and wherein each of the plurality of memory cells comprises a magnetic Josephson junction (MJJ) device, and wherein the MJJ device comprises a first superconducting layer, a second superconducting layer, wherein each of the first superconducting layer and the second superconducting layer is configured to allow a flow of a supercurrent through the MJJ device, and a magnetic layer arranged between the first superconducting layer and the second superconducting layer, wherein the magnetic layer has an associated magnetization direction, and wherein the first state of the memory cell corresponds to a zero-phase of a supercurrent flowing through the MJJ device and the second state of the memory cell corresponds to a $\pi$-phase of the supercurrent flowing through the MJJ device, and wherein in response to an application of a magnetic field, without any change in the magnetization direction of the magnetic layer and without any change in a magnetization direction of each of other magnetic layers, if any, associated with the MJJ device, a memory cell is configured to switch from the first state of the memory cell to the second state of the memory cell responsive to a change in a phase of the supercurrent from either the zero-phase to the $\pi$-phase or from the $\pi$-phase to the zero-phase caused by the application of the magnetic field.

16. The memory system of claim 15, wherein the MJJ device is coupled to a first Josephson junction and a second Josephson junction to form a loop.

17. The memory system of claim 16, wherein the memory cell is coupled to a write-bit line, and wherein the write bit-line is configured to receive a write current as part of a write operation associated with the memory cell.

18. The memory system of claim 17, wherein the write current is configured to apply the magnetic field to the magnetic layer.

19. The memory system of claim 15, wherein a thickness of the magnetic layer is selected such that the change in the phase of the supercurrent from either the zero-phase to the $\pi$-phase or from the $\pi$-phase to the zero-phase occurs in response to the magnetic field having a magnetizing field strength in a range between 1 Oersted to 50 Oersted.

20. The memory system of claim 15, wherein the MJJ device further comprises at least one antiferromagnetic layer arranged adjacent to the magnetic layer.

\* \* \* \* \*